United States Patent
Wu et al.

[11] Patent Number: 5,920,145
[45] Date of Patent: Jul. 6, 1999

[54] METHOD AND STRUCTURE FOR EMBEDDING PIEZOELECTRIC TRANSDUCERS IN THERMOPLASTIC COMPOSITES

[75] Inventors: Shu-Yau Wu, Artesia; Creed E. Blevins, Aliso Viejo, both of Calif.

[73] Assignee: McDonnell Douglas Corporation, Huntington Beach, Calif.

[21] Appl. No.: 08/711,029

[22] Filed: Sep. 9, 1996

[51] Int. Cl.$^6$ .................................................... H01L 41/08
[52] U.S. Cl. ........................ 310/328; 310/365; 310/346; 310/340
[58] Field of Search .................... 310/328, 366, 310/330–332, 340, 363, 364, 346, 365

[56] References Cited

U.S. PATENT DOCUMENTS

| | | | |
|---|---|---|---|
| 2,386,692 | 10/1945 | Kuenstler ................................. | 310/340 |
| 3,230,402 | 1/1966 | Nightingale et al. ................ | 310/340 X |
| 3,747,176 | 7/1973 | Toyoshima ........................... | 310/340 X |
| 4,445,256 | 5/1984 | Huguenin et al. ................... | 310/340 X |
| 4,849,668 | 7/1989 | Crawley et al. ........................ | 310/328 |
| 4,958,100 | 9/1990 | Crawley et al. ........................ | 310/328 |
| 5,305,507 | 4/1994 | Dvorsky et al. .................... | 310/340 X |
| 5,369,862 | 12/1994 | Kotani et al. ......................... | 29/25.35 |
| 5,374,011 | 12/1994 | Lazarus et al. ...................... | 310/328 X |
| 5,424,596 | 6/1995 | Mendenhall et al. ................... | 310/328 |
| 5,520,056 | 5/1996 | Buisson et al. ............................. | 74/784 |
| 5,525,853 | 6/1996 | Nye et al. ............................ | 310/331 X |
| 5,656,882 | 8/1997 | Lazarus et al. ........................ | 310/328 |

FOREIGN PATENT DOCUMENTS 0135213   5/1989   Japan ..................................... 310/340

*Primary Examiner*—Mark O. Budd
*Attorney, Agent, or Firm*—Alston & Bird LLP

[57] ABSTRACT

This invention consists of a method for embedding piezoelectric ceramic transducers in thermoplastic composites. The piezoelectric ceramic transducer to be embedded in a graphite/PEEK composite is first bonded with two fine silver wires for electrical connection, one on each major surface. The bonding agent is a high temperature conductive adhesive compound, such as a silver/glass frit. The fusing of the frit bonding agent is done in an over at, a high temperature (i.e. 600° F. or higher) for 5 to 10 minutes. Bonds are applied at several discrete spots on the zig zag wire which relieves thermal stresses induced during cooling due to a mismatch of the coefficient of thermal expansion between the ceramic material and the wire. After the connecting wires are attached, the wires and transducer are wrapped with several plies of insulating glass/PEEK cloth to prevent electrical shorting between the two silver wires through the graphite/PEEK host. The insulating glass cloth and tube sheaths are impregnated with PEEK resin to improve the bonding to the surrounding structural materials. To compensate for non-uniform stresses and prevent the composite plate from warping or distorting during the consolidation process, a compensating layer made from several plies of the same glass/PEEK cloth used to wrap the ceramic transducer is placed under the cutouts on the opposite side of the plate/ply structure. When the consolidation is completed, the piezoelectric ceramic transducer is electrically poled with a high electric field (dependent on the specific ceramic material) at a temperature of around 200 to 350 degrees Fahrenheit, which repoles the ceramic, transducer.

17 Claims, 4 Drawing Sheets

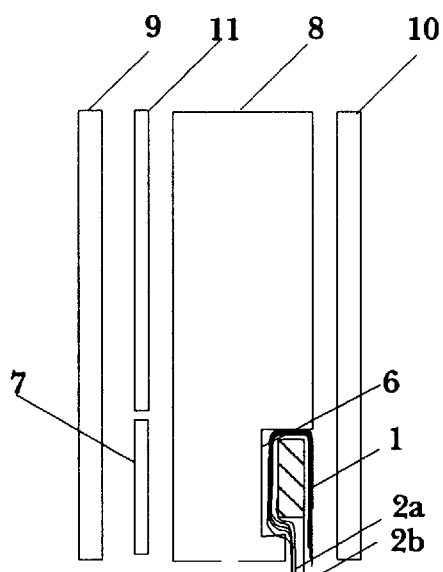
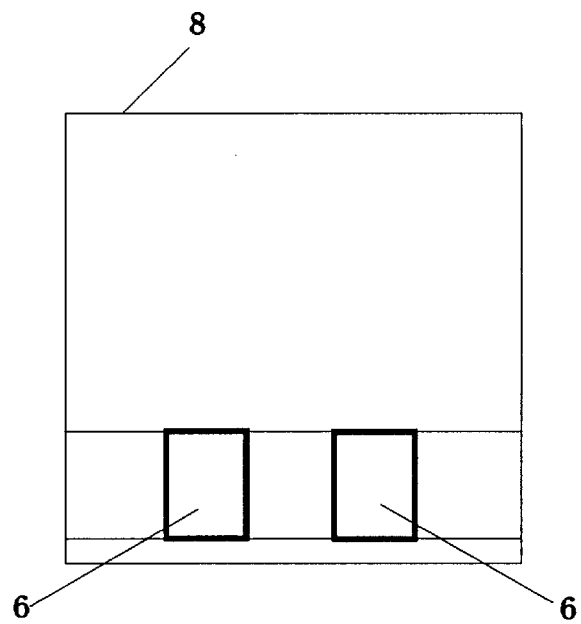
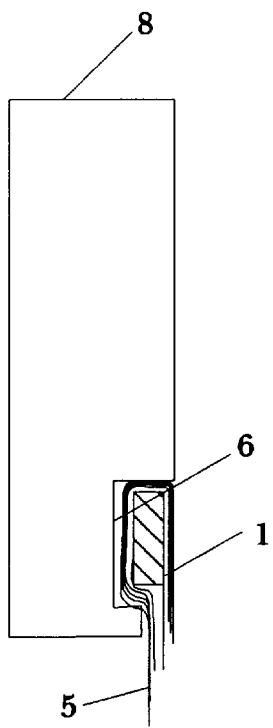
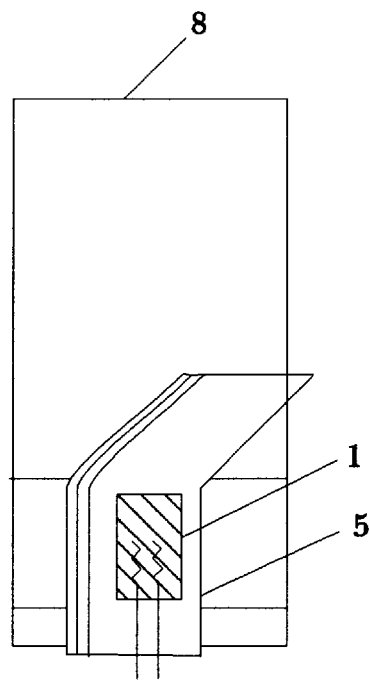
FIGURE 2   FIGURE 3
FIGURE 4   FIGURE 5

METHOD AND STRUCTURE FOR EMBEDDING PIEZOELECTRIC TRANSDUCERS IN THERMOPLASTIC COMPOSITES

BACKGROUND OF THE INVENTION

1. Field of the Invention

The field of this invention relates piezoelectric ceramic transducers and embedding such piezoelectric transducers in composites. More specifically, this relates to a method for embedding piezoelectric ceramic transducers in thermoplastic composites which are much tougher and as strong and stiff as thermoset composite materials, but have a higher consolidation temperature.

2. Related Art

Piezoelectric ceramic transducers have found many important applications in adaptive structures for vibration control and acoustic noise suppression in modern space, civilian and military systems, such as launch vehicles, space platforms, aircraft, submarines and helicopters. These transducers may be attached to or imbedded in advanced composite materials to form adaptive structures that are light weight, strong, and affordable both in manufacturing costs and long operating life. There have been several programs supported by the government to develop technology for the manufacturing and processing of advanced adaptive structures built with advanced composite materials incorporating active devices such as sensors and actuators. The following are a, few examples. These include those devices described in "Advanced Composites with Embedded Sensors and Actuators (ACESA)" by Boeing Aerospace and Electronics Division, Seattle, Wash., pursuant to Air Force Astronautic Laboratory Contract at Edwards Air Force Base, Calif., Contract F04611-88-C-0053; and a similar program by TRW Space & Technology Group in Redondo Beach, Calif., with the Astronautics Laboratory, Contract F04611-88-C-0054; and the "Synthesis and Processing of Intelligent, Cost Effective Structures (SPICES) Program" sponsored by the Advanced Research Projects Agency (ARPA), to develop cost effective, adaptive material processing and synthesis technologies for smart adaptive structures. In the first two of these programs, the transducer materials utilized were piezoelectric ceramics of lead-zirconate-titanate (PZT) and electrostrictive ceramics of lead-molybdenum-niobate (PMN). The transducers were bonded to or embedded in the host material. The host materials employed were low temperature graphite/epoxy thermoset composites, such as T300/934 (processing temperature in the range of 280° to 350° F.). Such graphite/epoxy materials havet the following disadvantages: their toughness is low; they will outgas, and absorb moisture; and they are vulnerable to degradation due to atomic oxygen, ultra violet and other radiation as well as hostile threats. Also of interest is U.S. Pat. No. 5,305,507 to DVORSKY et. al. The DVORSKY Patent described the method of encapsulating piezoelectric actuators for easy embedding thereof or lamination into the composite structure.

In the SPICES program, two materials were used as the host composite materials. The first was a thermoset, fiberglass/epoxy and the second was a thermoplastic, AS4/PEEK composite. The fiberglass/epoxy composites, which are electrically nonconductive, have the same low toughness as the conductive graphite/epoxy used by others. The embedding of ceramic transducers was done by a resin transfer molding (RTM) method and the highest temperature the ceramic transducers were subjected to was during cure at about 250 degrees Fahrenheit. The second composite material, (AS4/PEEK), has a much higher toughness than the thermoset materials. It outgasses very little. The material has a potential for low-cost fabrication and for simplified joining. The processing temperature for PEEK using the traditional lay-up and autoclave consolidation method for thermoplastic materials was about 600 to 800 degrees Fahrenheit. In the SPICES program, the operation of embedding active transducers and the consolidation of the host ply material was done by a fiber placement process. In this process, the thermoplastic ply is heated by a laser, fed under compaction onto previous plies and completely consolidated to them in one step. The ceramic transducer was sandwiched between a titanium metal frame and loaded manually in a predesigned cutout in the host material. The transducer was then covered with a thin copper shield to protect it from laser exposure every time the laser hit the composite ply tape over it during the tape laying and consolidating steps. Ceramic transducers so processed have a very loose electro-mechanical coupling with the host AS4/PEEK composite, likely due to the method used to embed the ceramic transducers. Results from piezoelectric shunt-damping tests indicated that the transducer's coupling coefficient was very low. When transducers were used as actuators for passive damping control, the measured resonant amplitude reduction was only a few decibels. When they were used as actuators for active vibration control, the signal was so low that a high gain amplifier was required to increase it. Low control authority of transducers was attributed to poor electro-mechanical coupling between the transducer and the host composite when ceramic transducers were embedded in the AS4/PEEK thermoplastic composite by the fiber placement process.

BRIEF DESCRIPTION OF THE INVENTION

The method of this invention for embedding piezoelectric ceramic transducers in thermoplastic composites (which are much tougher and as strong and stiff as the thermoset materials described above) is different from the related art in that the composite structures in the above-identified methods, (including specifically U.S. Pat. No. 5,305,507 to DVORSKY), are made from thermoset materials whose cure temperature is low, about 280 to 350 degrees Fahrenheit. The thermoplastic materials used in this invention have a higher softening temperature than the thermoset materials. That is, the processing and consolidation temperature is usually higher than 700 degrees Fahrenheit, which is higher than the melting temperature of most common solders used for attaching wires. It is also a much higher temperature than a conductive epoxy, also used for bonding wires, can tolerate and in fact, it is higher than the Curie temperature of most piezoelectric ceramic transducer materials such as PZT and PMN. This high processing temperature will break the solder or conductive epoxy bond between the wire and the ceramic electrode when the bond is subjected to such a temperature level. It will also cause the electric polarization previously established in the ceramic device to dipole, or lose the piezoelectric property completely. Therefore, in order to embed a piezoelectric ceramic transducer in a thermoplastic composite, the prior methods used for embedding piezoelectric ceramic transducers in thermoset materials are ineffective for high temperature thermoplastic composite materials. In the instant invention, the process for embedding piezoelectric ceramic transducers in thermoplastic composites is conducted at a high temperature, i.e., a temperature higher than required for cure in the fiber placement process mentioned above. The consolidation of graphite/PEEK plies with ceramic transducers placed in cutouts in the laminate is done using a hot platen-press method or by using an autoclave with a consolidation temperature above 600 degrees Fahrenheit.

The piezoelectric ceramic transducer to be embedded in the graphite/PEEK composite is first bonded with two fine silver wires for electrical connection, one on each major surface. The bonding agent is a high temperature conductive adhesive compound, such as silver/glass frit. This high temperature bonding agent fuses at the high temperature required in the fabrication of the composite and remains firmly on the ceramic electrode throughout the entire composite consolidation process. The wires are formed in a zig zag shape or pattern prior to bonding on the ceramic. This is done in order to provide multiple areas of electrical contact and activity. The bonding agent is then applied on to the wire at several locations along the zig zag wire to ensure adequate connection during the high temperature composite consolidation process. The fusing of the frit bonding agent is done in an oven at high temperature (i.e. 600° F. or higher) for 5 to 10 minutes. Bonds are also applied at several discrete spots on the zig zag wire for the purpose of relieving thermal stresses induced during cooling due to a mismatch of coefficient of thermal expansion between the ceramic and the wire.

After the ceramic connecting wires are attached, the wires and the transducer are wrapped with several plies of insulating glass/PEEK cloth. The glass/PEEK insulating cloth prevents electrical shorting between the two silver electrodes through the graphite/PEEK host, which is electrically conductive. The remainder of the silver connecting wires which are not bonded to the ceramic are also insulated, using braided nonconducting glass tube sheaths. Both the insulating glass cloth and tube sheaths are impregnated with PEEK resin to improve the bonding to the surrounding structural materials. To compensate for non-uniform stresses and prevent the composite plate from warping or distorting during the consolidation process, a compensating layer made from several plies of the same glass/PEEK cloth used to wrap the ceramic is placed under the cutouts on the opposite side of the plate/ply structure. After the ply structure has been consolidated, the piezoelectric ceramic transducers are electrically poled with a high electric field (dependent on the specific ceramic material) at a temperature of around 200 to 350 degrees Fahrenheit, which repoles the ceramic after the composite consolidation process at the higher temperature of 720 degrees Fahrenheit or so and at a pressure of approximately 200 pounds per square inch. The thermoplastic composite is much tougher and as strong as the thermoset composite. Therefore, the material made from the former composite with an embedded piezoelectric ceramic transducer in it results in a more robust product than that made using thermoset composites. The thermoplastic composite also does not outgas and is far superior for use for aircraft, missile and space applications.

BRIEF DESCRIPTION OF THE DRAWINGS

FIG. 2 shows a side view lay up arrangement of the composite plies with the PZT and the cutout before consolidation.

FIG. 3 shows a top view of the composite material with cutouts.

FIG. 4 shows a side view of the PZT ceramic wrapped with PEEK impregnated glass cloth.

FIG. 5 shows a top view of the PZT ceramic transducer to be wrapped by a sizde view of the PEEK impregnated glass cloth.

DESCRIPTION OF THE PREFERRED EMBODIMENT

The method and apparatus of this invention for embedding piezoelectric ceramic transducers in thermoplastic composites (which are much tougher and as strong and stiff as the thermoset materials) described above is different from the related art in that the related art composite structures are made from thermoset materials whose cure temperature is low, about 280 to 350 degrees Fahrenheit. The thermoplastic materials used in this invention have a higher softening temperature than most thermoset materials, in the range of 600° to 800° Fahrenheit. That is, the processing and consolidation temperature is higher than the melting temperature of most lead based solders used for attaching wires. It is also a much higher temperature than can be tolerated by conductive epoxy, also used for bonding wires. In fact, it is higher than the depoling temperature for most piezoelectric ceramic transducer materials made of PZT and PMN. In the instant invention, the process for embedding piezoelectric ceramic transducers in thermoplastic composites is conducted at such high temperatures, that is, a temperature higher than the fiber placement process mentioned above. The consolidation of graphite/PEEK plies with a ceramic transducer placed in a cutout and a laminate is done using the hot platen-press method or by using an autoclave with a consolidation temperature above 600° Fahrenheit.

Figure 1:
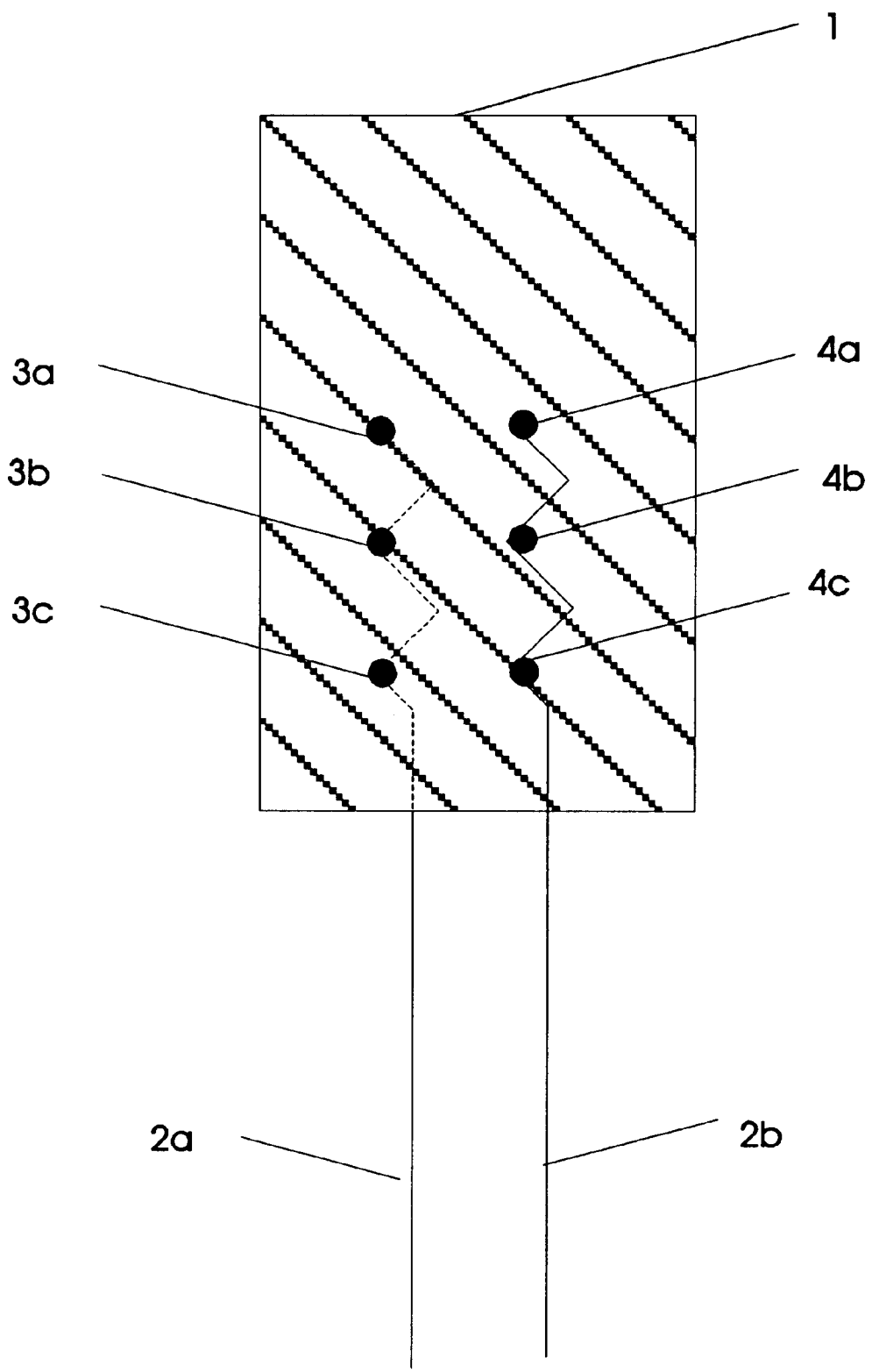
FIG. 1 shows the zig zag silver wires bonded on the PZT at discrete points.

As shown in FIG. 1, the piezoelectric ceramic transducer 1 to be embedded in the graphite/PEEK composite is first bonded with two fine silver wires 2a and 2b on either side of the ceramic to serve as electrical conductors. The bonding agent is a high, temperature conductive adhesive compound, such as a silver/glass frit. This high temperature bonding agent fuses at the high temperature required in the fabrication of the composite and remains firmly in electrical and physical contact on the ceramic throughout the entire composite consolidation process. The wires 2a and 2b are formed into a zig zag shape or other stress relieving pattern prior to bonding on the ceramic. This is done in order to provide multiple areas of electrical contact while providing stress relief. The bonding agent is applied on the wire at several locations along the zig zag wire to ensure adequate contact during the high temperature composite consolidation process. Bonds are applied at several discrete spots 3a, 3b and 3c and 4a, 4b and 4c, for example, on the zig zag wires to relieve thermal stresses induced during temperature changes due to a mismatch of coefficient of thermal expansion between the ceramic and the wire.

After the ceramic connecting wires are attached, the wires and the transducer are wrapped with several plies of insulating glass/PEEK cloth 5 as shown in FIGS. 2, 4 and 5. These glass plies are impregnated or powder-coated with PEEK and folded around the ceramic transducer to insulate it. The glass/PEEK insulating cloth 5 prevents electrical shorting between the two silver electrodes 2a and 2b through the graphite/PEEK host, which is electrically conductive. The remainder of the silver connecting wires 2a and 2b which are not bonded to the ceramic transducer are also insulated with braided nonconducting glass tube sheaths (not shown) for the same reason. Both the insulating glass cloth and. tube sheaths are impregnated with PEEK resin or powder coated to improve bonding to the surrounding structural materials. FIG. 2 shows the composite ply structure from the side view having a bottom layer 9, an intermediate layer 8 and a top layer 10.

The intermediate layer 8 is provided with cutouts 6 for receiving the ceramic transducer and its glass/PEEK wrap 5. There may be a plurality of such cutouts 6 as shown in FIG. 3. Such cutouts may be as much as seven layers deep. In the specific embodiment the cutouts are 2.3 inches by 0.75 inches by 0.035 inches in size.

To compensate for non-uniform stresses encountered due to the presence of the transducer and the hole 6 in the composite (which can be up to seven layers deep) and to prevent the composite plate from warping or distorting during the consolidation process, a compensating layer 7 made from several plies of the same glass/PEEK cloth used to wrap the ceramic transducer 1 is placed under the cutouts on the opposite side of the plate/ply structure 8 as shown in FIG. 2. An equal number of 5 mil glass/PEEK layers in the compensating layer is required to balance the plies wrapped around the ceramic transducer. In this particular case three plies of glass/PEEK cloth were wrapped around the ceramic transducer and six. compensating plies were included in the compensating layer. The compensating plies are required to prevent the structure from warping during cooling. The supporting layer 11 is formed from several plies of the same graphite/PEEK material as the rest of the structure.

The entire composite package is then consolidated either by the hot platen-press method of compaction or by using an autoclave with consolidation temperatures above 600° Fahrenheit. In this particular case, a temperature of 720° Fahrenheit was used at 200 psi. The fusing of the frit bonding agent is done in an oven at a high temperature for 5 to 10 minutes. The silver/glass frit can be fused to the ceramic device at approximately 720° Fahrenheit. However, once fused, the bond will tolerate temperatures of up to 820° Fahrenheit without deteriorating. This is significantly higher than the bonding temperature of conductive epoxies or solders used in the related art methods. After the ply structure has been consolidated, the piezoelectric ceramic transducers are electrically poled with an electric field (for the specific ceramic material) at a temperature of around 200° to 350° Fahrenheit. (sufficient to repole the ceramic transducer after the composite consolidation process at the higher temperature). This results in a thermoplastic composite which is much tougher and as strong and stiff as the thermoset composite. Adaptive structures made from the former composite with an embedded piezoelectric ceramic transducer are more robust than those made using thermoset composites. The thermoplastic composite does not outgas and is far superior for use in aircraft, missile and space applications.

Figure 6A:
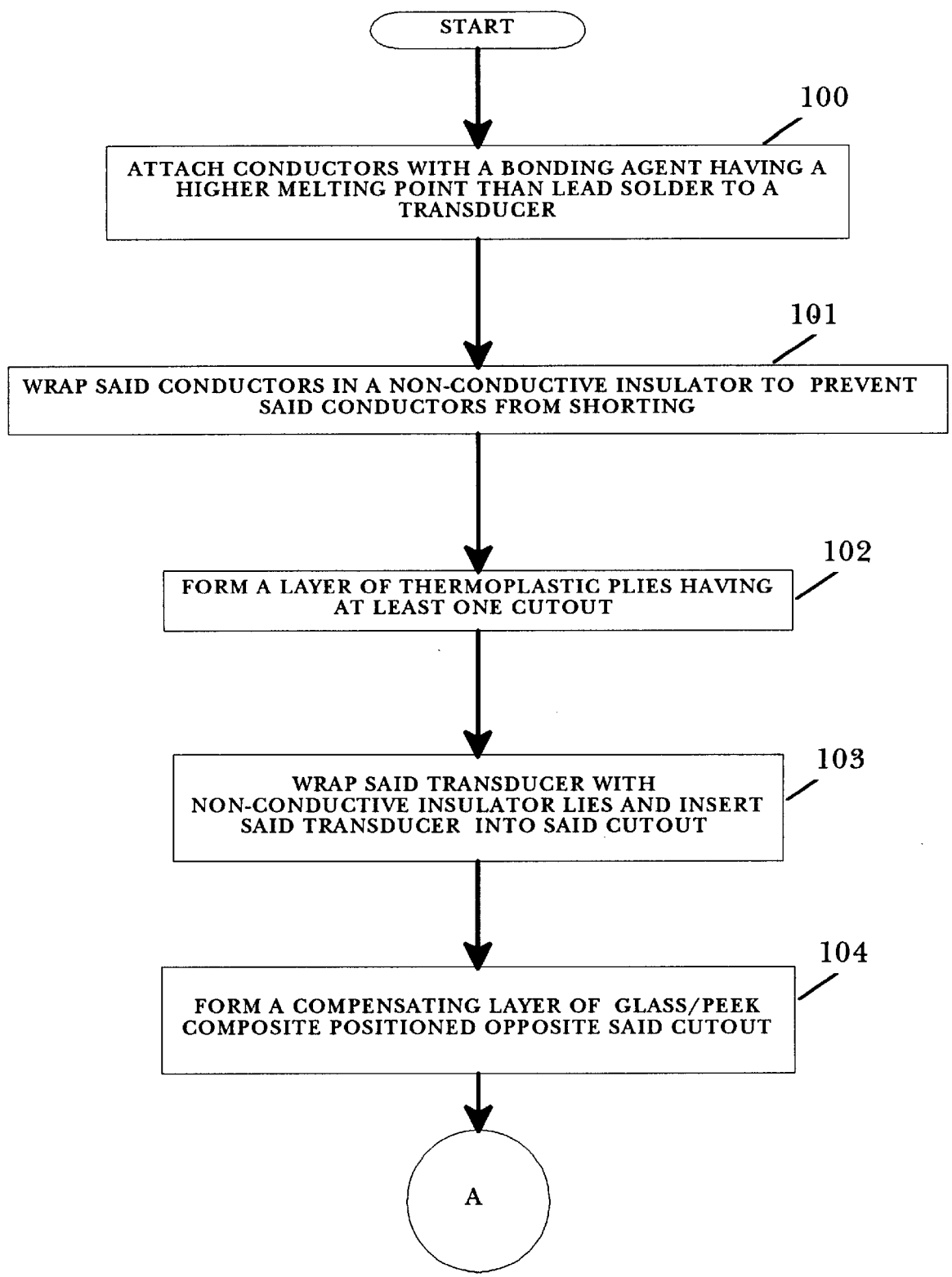
FIGS. 6A and 6B are a flow chart of the method of imbedding the ceramic transducer.
Figure 6B:
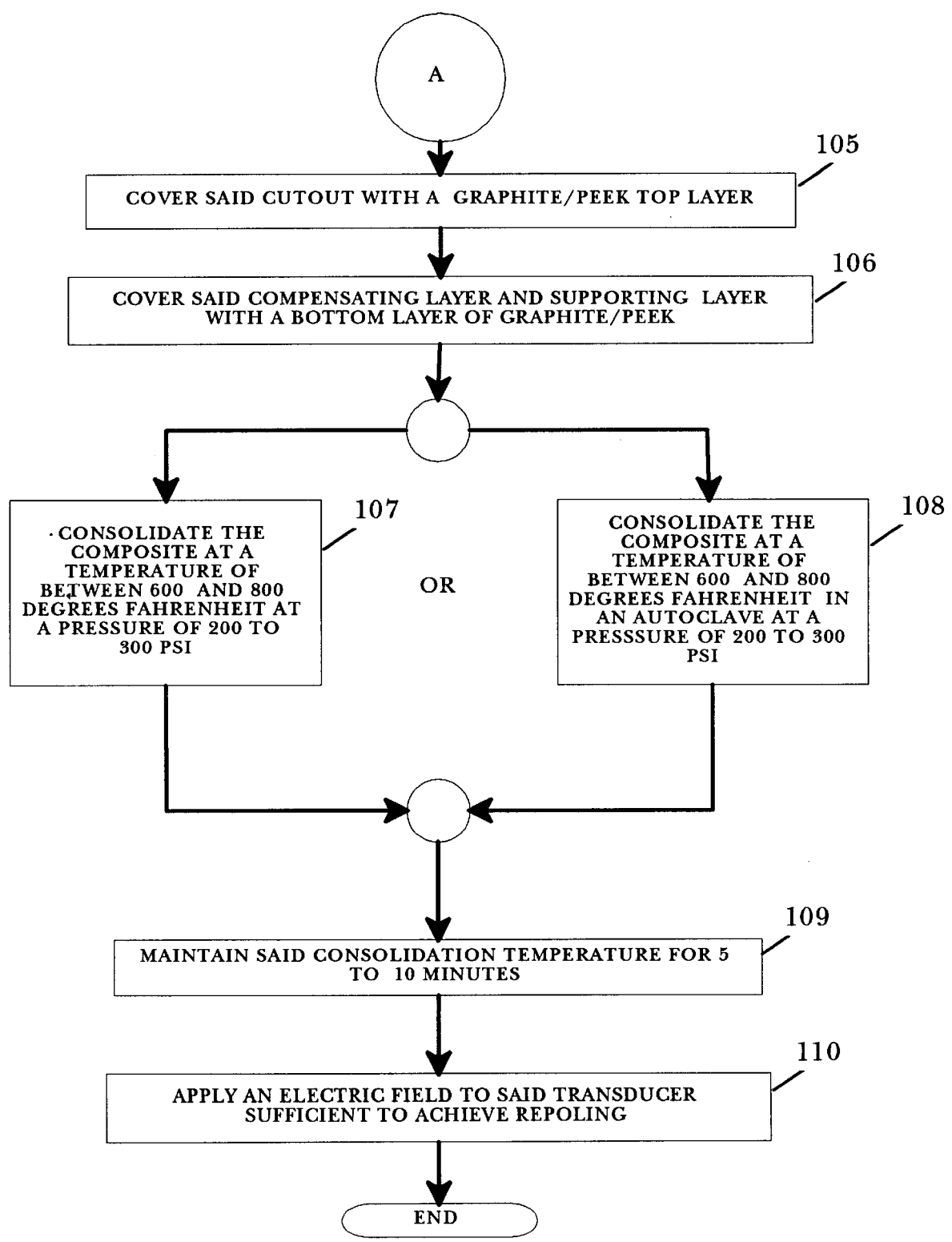

The specific process is as follows: With reference to FIG. 6a and 6b, using a bonding agent having a higher melting point than lead solder, the wire conductors are attached to a ceramic transducer, step 100. The conductors are then wrapped with a non-conductive insulator to prevent the conductors from shorting, step 101. A layer of thermoplastic plies having at least one cutout for receiving the transducer wrapped in its insulating cover is formed, step 102. The transducer and its wrapper are inserted into the cutout, step 103. A compensating layer of glass/PEEK composite is positioned opposite to the cutout layer to prevent warping of the panel during cooling, step 104. The cutout is covered with a graphite/PEEK top layer, step 105. The bottom of the composite lay-up is also covered by laying a bottom graphite/PEEK layer under the compensatory layer and the supporting layer, step 106. Consolidate the composite at a temperature between 600° to 800° Fahrenheit and at a pressure of 200 to 300 psi, step 107 or consolidate the composite at a temperature between 600° to 800° Fahrenheit in an autoclave, step 108. Maintain the consolidation temperature for five to ten minutes, step 109. Apply an electric field to the transducer at a temperature of around 200° to 350° Fahrenheit to achieve repoling, step 110.

Having thus described the invention, what is claimed is:

1. A high temperature composite structure formed at temperatures in excess of that required for thermoset epoxy-based composite structures comprising:

a. at least one layer of thermoplastic material having first and second opposed sides;

b. at least one piezoelectric transducer embedded in a portion of said thermoplastic material, wherein said piezoelectric transducer is located nearer to the first side of said thermoplastic material than the opposed second side of said thermoplastic material;

c. a pair of electrical conductors electrically connected to said piezoelectric transducer;

d. an insulating layer disposed between said piezoelectric transducer and said thermoplastic material, wherein said insulating layer insulates the piezoelectric transducer from said thermoplastic material; and e. a compensating layer disposed on said second side of said thermoplastic layer, wherein said compensating layer compensates for non-uniform stresses introduced into the thermoplastic material by said piezoelectric transducer and said insulating layer.

2. A composite structure as described in claim 1 wherein said electrical conductors are attached to said piezoelectric transducer by an electrically conductive bonding material having a higher melting point than the consolidation temperature of the composite structure.

3. A composite structure as described in claim 2 wherein said structure comprises a thermoplastic composite material.

4. A composite structure as described in claim 3 wherein said thermoplastic material comprises a graphite/PEEK composite.

5. A composite structure as described in claim 2 wherein said bonding material is selected from the group consisting of:

a. silver/glass frit compound, b. silver solder, c. silver solder paste, and d. a combination of silver/glass frit compound, silver solder or silver solder paste.

6. A high temperature composite structure formed at temperatures in excess of that required for thermoset epoxy-based composite structure comprising:

a. at least one layer of thermoplastic material;

b. at least one piezoelectric transducer embedded in a portion of said thermoplastic material; and c. a pair of electrical conductors electrically connected to said piezoelectric transducer; wherein said electrical conductors are bent to form a stress relieving pattern on said transducer and attached at selected points to said transducer by an electrically conductive bonding material.

7. A composite structure as described in claim 6 wherein said electrical conductors are attached to said piezoelectric transducer by an electrically conductive bonding material having a higher melting point than the consolidation temperature of the composite structure.

8. A composite structure as described in claim 7 wherein said structure comprises a thermoplastic composite material.

9. A composite structure as described in claim 8 wherein said thermoplastic material comprises a graphite/PEEK composite.

10. A composite structure as described in claim 6 wherein said bonding material comprises an adhesive silver/glass frit compound.

11. A composite structure as described in claim 2 wherein said bonding material is selected from the group consisting of:
   a. silver/glass frit compound,
   b. silver solder,
   c. silver solder paste, and
   d. a combination of silver/glass frit compound, silver solder or silver solder paste.

12. A composite structure as described in claim 1, wherein said compensating layer is disposed on said second side of said thermoplastic material such that said compensating layer is in general alignment with said insulating layer.

13. A composite structure as described in claim 12, wherein said compensating layer comprises the same material as said insulating layer.

14. A composite structure as described in claim 12, wherein said compensating layer has substantially the same thickness as said insulating layer.

15. A composite structure as described in claim 12 further comprising a support layer disposed on said second side of said thermoplastic material adjacent to said compensating layer.

16. A composite structure as described in claim 5, wherein said support layer comprises the same material as said compensating layer.

17. A composite structure as described in claim 5 further comprising first and second composite plates, wherein said first composite plate overlies said first side of said thermoplastic material and said piezoelectric transducer and said second composite plate overlies said compensating and support layers.

* * * * *

UNITED STATES PATENT AND TRADEMARK OFFICE
CERTIFICATE OF CORRECTION

PATENT NO. : 5,920,145
DATED : July 6, 1999
INVENTOR(S) : Wu et al.

It is certified that error appears in the above-identified patent and that said Letters Patent is hereby corrected as shown below:

On the title page, [57] Abstract, line 8, after "at" cancel the comma (,); last line, after "ceramic" cancel the comma (,).

Column 8, line 11, "claim 5" should read --claim 15--; line 14, "claim 5" should read --claim 15--.

Signed and Sealed this

Twenty-first Day of December, 1999

Attest:

Q. TODD DICKINSON

*Attesting Officer*    *Acting Commissioner of Patents and Trademarks*